United States Patent
Bremmer et al.

(10) Patent No.: US 6,210,749 B1
(45) Date of Patent: Apr. 3, 2001

(54) THERMALLY STABLE DIELECTRIC COATINGS

(75) Inventors: Jeffrey Nicholas Bremmer; Kyuha Chung, both of Midland; Chandan Kumar Saha, West Bloomfield; Michael John Spaulding, Bay City, all of MI (US)

(73) Assignee: Dow Corning, Corporation, Midland, MI (US)

( * ) Notice: Subject to any disclaimer, the term of this patent is extended or adjusted under 35 U.S.C. 154(b) by 0 days.

(21) Appl. No.: 09/516,087

(22) Filed: Mar. 1, 2000

Related U.S. Application Data

(63) Continuation of application No. 08/870,564, filed on Jun. 6, 1997, now abandoned.

(51) Int. Cl.[7] .................................................... B05D 4/12
(52) U.S. Cl. ........................ 427/126.2; 427/226; 427/240; 427/376.2; 427/377; 427/387; 427/397.7; 427/421; 427/430.1
(58) Field of Search ................................ 427/126.2, 226, 427/240, 376.2, 377, 387, 397.7, 421, 430.1

(56) References Cited

U.S. PATENT DOCUMENTS

| | | | |
|---|---|---|---|
| 3,615,272 | 10/1971 | Collins et al. | 23/366 |
| 4,756,977 | * 7/1988 | Haluska et al. | 428/704 |
| 4,808,653 | 2/1989 | Haluska et al. | 524/398 |
| 4,822,697 | 4/1989 | Haluska et al. | 428/698 |
| 4,981,724 | * 1/1991 | Hochberg et al. | 427/255.3 |
| 4,999,397 | 3/1991 | Weiss et al. | 524/755 |
| 5,008,320 | 4/1991 | Haluska et al. | 524/361 |
| 5,010,159 | 4/1991 | Bank et al. | 528/23 |
| 5,059,449 | 10/1991 | Chandra et al. | 427/53.1 |
| 5,063,267 | 11/1991 | Hanneman et al. | 524/284 |
| 5,145,723 | 9/1992 | Ballance et al. | 427/397.7 |
| 5,262,201 | * 11/1993 | Chandra et al. | 427/376.2 |
| 5,290,354 | 3/1994 | Haluska | 106/479 |
| 5,370,903 | 12/1994 | Mine et al. | 427/126.2 |
| 5,370,904 | * 12/1994 | Mine et al. | 427/126.2 |
| 5,380,567 | 1/1995 | Haluska | 427/578 |
| 5,416,190 | 5/1995 | Mine et al. | 528/492 |
| 5,436,029 | * 7/1995 | Ballance et al. | 427/126.2 |
| 5,458,912 | 10/1995 | Camilletti et al. | 427/126.4 |
| 5,506,177 | 4/1996 | Kishimoto et al. | 437/195 |
| 5,549,934 | * 8/1996 | Garza et al. | 427/489 |
| 5,607,773 | 3/1997 | Ahlburn et al. | 428/427 |
| 5,684,356 | * 11/1997 | Jeng et al. | 303/336 |
| 5,766,680 | * 6/1998 | Schmidt et al. | 427/226 |

FOREIGN PATENT DOCUMENTS

| | | | |
|---|---|---|---|
| 0 604 779 A1 | 6/1994 | (EP) | C04B/41/50 |
| 59-178749 | 3/1983 | (JP) | H01L/21/88 |
| 63-107122 | 10/1986 | (JP) | H01L/21/312 |
| 60-86017 | 8/1991 | (JP) | H04N/1/04 |

OTHER PUBLICATIONS

Grayson, Martin, ed. Encyclopedia of Semiconductor Technology, pp. 306–307.*

* cited by examiner

*Primary Examiner*—Shrive Beck
*Assistant Examiner*—Paul D. Strain
(74) *Attorney, Agent, or Firm*—Rick D. Streu

(57) ABSTRACT

This invention pertains to a method for producing thermally stable multi-layer coatings and the coatings produced therefrom. The multi-layer coating is comprised of a first coating produced from hydrogen silsesquioxane having a thickness of 1.25 to 2.25 μm and a second coating comprising silicon dioxide having a thickness of at least 100 nm. The method for producing the first coating comprises applying a fillerless hydrogen silsesquioxane resin composition onto a substrate and thereafter heating the hydrogen silsesquioxane resin at a temperature of 150° C. to 500° C. for a sufficient period of time to produce a crack-free coating having a thickness of 1.25 μm to 2.25 μm. The second coating is produced by depositing, preferably by PECVD, silicon dioxide over the first coating at a thickness of at least 100 nm.

27 Claims, No Drawings

THERMALLY STABLE DIELECTRIC COATINGS the application is a continuation of U.S. patent application Ser. No. 08/870,564, filed Jun. 6, 1997, now abandoned

BACKGROUND OF THE INVENTION

This invention pertains to a method for producing thermally stable dielectric coatings comprising a first coating having a thickness of 1.25 to 2.25 µm produced from a hydrogen silsesquioxane resin and a second coating having a thickness of at least 100 nm comprised of silicon dioxide ($SiO_2$). It has been found that when a silicon dioxide coating having a thickness of at least 100 nm is applied over the hydrogen silsesquioxane resin based coating that the hydrogen silsesquioxane coatings resist cracking in subsequent thermal processing thus producing thermally stable dielectric coatings.

A method for formation of multi-layer coatings of limited thicknesses for interlevel dielectrics and passivation on semiconductor devices is known in the art. Under the current application method, as described in U.S. Pat. No. 5,145,723, a hydrogen silsesquioxane resin is spun onto the semiconductor device, and any solvent is removed to produce a hydrogen silsesquioxane film on the device. The hydrogen silsesquioxane film is heated by placing the semiconductor device on hot plates (150° C. to 350° C.) to soften and flow the hydrogen silsesquioxane resin and finally the hydrogen silsesquioxane film is cured by heating in an oven at about 400° C. to 450° C. for 1 hour. However, the method is effective for producing crack-free coatings only with thin layers (<1.2 µm) of hydrogen silsesquioxane resin ceramic. This thin layer does not adequately cover the metal layer and therefore to produce the interlevel dielectric it is required to apply a thick $SiO_2$ layer over the hydrogen silsesquioxane ceramic.

Another method for producing multi-layer coatings on integrated circuits from hydrogen silsesquioxane resin is described in U.S. Pat. No. 4,756,977 to Haluska et al. According to '977 a first layer is produced by applying a solvent solution of hydrogen silsesquioxane resin to the device, the solvent is removed and the coating is ceramified by heating to a temperature of between 150° C. and 1000° C. The hydrogen silsesquioxane resin based coatings produced by the method described in '977 have a thickness of approximately 3,000 to 5,000 angstroms (0.3 to 0.5 µm). A passivating coating is applied over the hydrogen silsesquioxane resin based coating. The passivating coating may be a Si, SiN, SiC or SiCN containing coating.

It is desirable to have coatings produced from hydrogen silsesquioxane thicker to adequately cover the metallization. However, when thick coatings are produced using the current processing methods, they contain undesirable cracks.

Other methods for curing hydrogen silsesquioxane resin are known in the art, however, these methods do not teach how to form thick coatings (1.25 µm or greater). For example, U.S. Pat. Nos. 5,380,567, 5,370,904 and 5,370,903 describe curing of hydrogen silsesquioxane resin in an inert atmosphere. U.S. Pat. No. 5,380,567 to Haluska et al. discloses the cure of hydrogen silsesquioxane resin in an inert atmosphere at temperatures of 500° C. to 1000° C. (coating thickness 0.2 µm). U.S. Pat. No. 5,370,904 to Mine et al. discloses a method for the formation of thick silicon oxide films wherein the method comprises forming a hydrogen silsesquioxane resin film on the surface and thereafter heating the film in an inert atmosphere at a temperature of from 250° C. to 500° C. until the content of the SiH in the silicon oxide product has reached ≦80% of the content of SiH in the hydrogen silsesquioxane (coating thicknesses 1.0–1.23 µm). U.S. Pat. No. 5,370,903 to Mine et al. discloses a method for the formation of thick silicon oxide films wherein the method comprises forming a hydrogen silsesquioxane resin film on the surface and thereafter heating the film in a mixed gas atmosphere (≦20% vol $O_2$) at a temperature of from 250° C. to 500° C. until the content of the SiH in the silicon oxide product has reached ≦80% of the content of SiH in the hydrogen silsesquioxane (coating thicknesses 1.02–1.10 µm).

Additionally, U.S. Pat. No. 5,059,448 to Chandra et al. discloses the use of rapid thermal processing to produce coatings of 1 µm or less (0.13 to 0.945 µm). In '448 the hydrogen silsesquioxane resin film is exposed to a high intensity radiation to quickly heat the film at a temperature of 50° C. to 1000° C.

Thicker coatings have been produced by adding fillers to hydrogen silsesquioxane resin. However, because of the presence of the filler and the effect of the filler on the properties of the coating, these coatings are not necessarily suitable as interlevel dielectrics. For Example, U.S. Pat. No. 5,458,912 to Camilletti et al. discloses a method for forming tamper-proof coatings on electronic devices by applying to the device a coating comprising a silica precursor and a filler and thereafter heating at a temperature sufficient to convert the silica precursor to a silica containing ceramic matrix. The coatings produced have thicknesses of 20 to 48 µm.

It has now been found that when the cure conditions (time, temperature and environment) are controlled, a crack-free insoluble coating having a thickness of greater than 1.25 µm can be produced from hydrogen silsesquioxane resins. It has also been found that when a layer of silicon dioxide having a thickness of at least nm is applied over the hydrogen silsesquioxane resin based coating, the coatings are stable (remain crack-free) when exposed to subsequent thermal processing.

SUMMARY OF THE INVENTION

This invention pertains to a method for producing thermally stable multi-layer coatings and the coatings produced therefrom. The multi-layer coating is comprised of a first coating produced from hydrogen silsesquioxane having a thickness of 1.25 to 2.25 µm and a second coating comprising silicon dioxide ($SiO_2$) having a thickness of at least 100 nm.

The method for producing the first coating comprises applying a fillerless hydrogen silsesquioxane resin composition onto a substrate and thereafter heating the hydrogen silsesquioxane resin at a temperature of 150° C. to 500° C. for a sufficient period of time to produce a crack-free coating having a thickness of 1.25 µm to 2.25 µm. The second coating is produced by depositing, preferably by PECVD, silicon dioxide over the first coating at a thickness at least 100 nm. The multi-layer coating is stable (remains crack-free) when exposed to subsequent thermal processing.

THE INVENTION

This invention pertains to a method for producing thermally stable multi-layer coatings and the coatings produced therefrom. The multi-layer coatings are useful on any substrate such as metals or ceramics but are particularly useful on electronic substrates. By "thermally stable" it is meant that the coatings do not develop cracks when exposed to subsequent thermal processing (temperatures ≦450° C.), including cure processing (up to 4 cycles) and annealing (both $O_2$ and $N_2$). By "electronic substrate" it is meant to include silicon based devices and gallium arsenide based devices intended for use in the manufacture of a semiconductor component including focal plane arrays, optoelectronic devices, photovoltaic cells, optical devices, transistor-like devices, 3-D devices, silicon-on-insulator devices, super lattice devices and the like.

The multi-layer coatings produced herein may be applied to a wafer prior to the application of any metallization. They may be applied over metallization as an interlevel dielectric or they may be applied as a top passivation coating to complete the formation of the integrated circuit.

Additionally, the electronic substrate can be bare (i.e. no passivation) or the substrate can have a primary passivation. Such primary passivation can be ceramic coatings such as silica, silicon nitride, silicon carbide, silicon oxynitride, silicon oxycarbide, PSG, BPSG and others deposited by CVD, PVD, PECVD or sol-gel approaches. Primary passivation and methods of depositing are known to those skilled in the art. Preferably the electronic substrate has a primary passivation layer comprised of silica having a thickness of up to 300 nm, preferably 30 nm to 300 nm.

The first layer of the multi-layer coating of the instant invention is produced by applying a fillerless composition comprising hydrogen silsesquioxane resin onto a substrate. The hydrogen silsesquioxane resin includes hydridosiloxane resins consisting of units of the formula $HSi(OH)_x(OR)_yO_{z/2}$, in which each R is independently an organic group or a substituted organic group which, when bonded to silicon through the oxygen atom, forms a hydrolyzable substituent, x=0 to 2, y=0 to 2, z=1 to 3, x+y+z=3. Examples of R include alkyls such as methyl, ethyl, propyl, butyl, and others, aryls such as phenyl, and alkenyls such as allyl or vinyl. These resins may be essentially fully condensed $(HSiO_{3/2})_n$ wherein n is 8 or greater or they may be only partially hydrolyzed (i.e., containing some Si—OR) and/or partially condensed (i.e., containing some Si—OH). Although not represented by this structure, these resins may also contain a small number (e.g., less than about 10%) of silicon atoms which have either 0 or 2 hydrogen atoms attached thereto or a small number of SiC bonds due to various factors involved in their formation or handling.

The above H-resins and methods for their production are known in the art. For example, Collins et al. in U.S. Pat. No. 3,615,272,which is incorporated herein by reference, teach the production of a nearly fully condensed H-resin (which may contain up to 100–300 ppm silanol) by a process comprising hydrolyzing trichlorosilane in a benzenesulfonic acid hydrate hydrolysis medium and then washing the resultant resin with water or aqueous sulfuric acid. Similarly, Bank et al. in U.S. Pat. No. 5,010,159,which is hereby incorporated by reference, teach an alternative method comprising hydrolyzing hydridosilanes in an arylsulfonic acid hydrate hydrolysis medium to form a resin which is then contacted with a neutralizing agent.

Other hydridosiloxane resins, such as those described by Frye et al. in U.S. Pat. No. 4,999,397, hereby incorporated by reference; those produced by hydrolyzing an alkoxy or acyloxy silane in an acidic, alcoholic hydrolysis medium; those described in Kokai Pat. Nos. 59-178749, 60-86017 and 63-107122; or any other equivalent hydridosiloxane, will also function herein.

Specific molecular weight fractions of the above H-resins may also be used in this process. Such fractions and methods for their preparation are taught in U.S. Pat. No. 5,063,267 to Hanneman et al. and in U.S. Pat. No. 5,416,190 to Mine et al., which are hereby incorporated by reference. A preferred fraction comprises material wherein at least 75% of the polymeric species have a molecular weight above about 1200 and a more preferred fraction comprises material wherein at least 75% of the polymeric species have a number average molecular weight between about 1200 and about 100,000.

The hydrogen silsesquioxane resin may contain a platinum, rhodium or copper catalyst to increase the rate and extent of cure of the hydrogen silsesquioxane resin. Generally, any platinum, rhodium or copper compound or complex which can be solubilized will be useful herein. For instance, platinum acetylacetonate, rhodium catalyst $RhCl_3[S(CH_2CH_2CH_2CH_3)_2]_3$, obtained from Dow Corning Corporation, Midland, Mich., or cupric naphthenate are all within the scope of this invention. These catalysts are generally added in an amount of between about 5 to 1000 ppm platinum, rhodium or copper based on the weight of hydrogen silsesquioxane resin. Platinum and rhodium catalysts useful herein are described in U.S. Pat. No. 4,822,697 to Haluska et al., herein incorporated by reference.

Ceramic oxide precursors may also be used in combination with the hydrogen silsesquioxane resin. The ceramic oxide precursors specifically contemplated herein include compounds of various metals such as aluminum, titanium, zirconium, tantalum, niobium and/or vanadium as well as various non-metallic compounds such as those of boron or phosphorous which may be dissolved in solution, hydrolyzed, and subsequently pyrolyzed at relatively low temperatures to form ceramic oxides.

The above ceramic oxide precursors generally have one or more hydrolyzable groups bonded to the above metal or non-metal, depending on the valence of the metal. The number of hydrolyzable groups to be included in these compounds is not critical as long as the compound is soluble or can be dispersed in the solvent. Likewise, selection of the exact hydrolyzable substituent is not critical since the substituents are either hydrolyzed or pyrolyzed out of the system. Typical hydrolyzable groups include, but are not limited to, alkoxy, such as methoxy, propoxy, butoxy and hexoxy, acyloxy, such as acetoxy, other organic groups bonded to said metal or non-metal through an oxygen such as acetylacetonate or an amino groups. Specific compounds, therefore, include zirconium tetracetylacetonate, titanium dibutoxy diacetylacetonate, aluminum triacetylacetonate, tetraisobutoxy titanium and $Ti(N(CH_3)_2)_4$. The ceramic oxide precursors useful herein are described in U.S. Pat. Nos. 4,808,653, 5,008,320 and 5,290,354, herein incorporated by reference.

When a ceramic oxide precursors is combined with the hydrogen silsesquioxane resin, generally it is used in an amount such that the final coating contains 0.1 to 30 percent by weight ceramic oxide precursor.

The hydrogen silsesquioxane resin is typically applied to the substrate as a solvent dispersion. Solvents which may be used include any agent or mixture of agents which will dissolve the hydrogen silsesquioxane resin to form a homogeneous liquid mixture without affecting the resulting coating. These solvents can include alcohols such as ethyl alcohol or isopropyl alcohol; aromatic hydrocarbons such as benzene or toluene; alkanes such as n-heptane, dodecane or nonane; ketones such as methyl iso-butyl ketone; esters; glycol ethers; siloxanes such as cyclic dimethylpolysiloxanes and linear dimethylpolysiloxanes (e.g.

hexamethyldisiloxane, octamethyltrisiloxane and mixtures thereof); and others. The solvent is present in an amount sufficient to dissolve the hydrogen silsesquioxane resin to the concentration desired for application. Typically the solvent is present in an amount of 20 to 99 wt %, preferably from 50 to 80 wt %, and most preferably at about 55 to 75 wt %.

Specific methods for application of the hydrogen silsesquioxane include, but are not limited to spin coating, dip coating, spray coating, flow coating, screen printing or others. The preferred method for application is spin coating. When a solvent is used, the solvent is allowed to evaporate from the coated substrate resulting in the deposition of a hydrogen silsesquioxane resin film. Any suitable means for evaporation may be used such as simple air drying by exposure to an ambient environment, by the application of a vacuum, or mild heat ($\leq 50°$) or during the early stages of the curing process. It should be noted that when spin coating is used, the additional drying method is minimized as the spinning drives off the solvent.

Following application to the substrate the hydrogen silsesquioxane resin film is cured to a crack-free insoluble coating by heating the hydrogen silsesquioxane film for a specific time at a temperature of 150° C. to 500° C., preferably 200° C. to 400° C., and more preferably 300° C. to 380° C. By "insoluble coating" it is meant a coating that is essentially not soluble in the solvent from which the hydrogen silsesquioxane resin was deposited to form the hydrogen silsesquioxane film or any solvent delineated above herein as being useful for the application of the hydrogen silsesquioxane resin. By "crack-free" it is meant a coating that does not contain any cracks visible to the human eye when examined under an optical microscope at 1000× magnification.

Any method of heating such as the use of a convection oven, rapid thermal processing, hot plate, or radiant of microwave energy may be used herein, preferably hot plates. The method used should be capable of rapidly heating the film to the desired temperature.

The duration of time that the coating is heated to cure will depend on the environment during the heating, the temperature at which it is heated (soak temperature), the rate at which it is heated and the thickness of the hydrogen silsesquioxane resin film. At higher soak temperatures and/or higher concentrations of oxygen in the cure environment the cure time will be shorter. Typically the coatings are heated from 1 second to 2 hours, preferably from 5 seconds to 30 minutes.

If the coating is not heated long enough or is heated too long at the soak temperature then cracking will result. Essentially there is a window of time at a given soak temperature and environment for a given coating thickness that will produce a crack free coating. At lower soak temperatures, this window is larger. As the temperature increases, this window decreases. Further as the amount of oxygen present in the environment increases, this window decreases. For example, for a film thickness of approximately 2 $\mu$m, when the film is cured in an inert atmosphere (<50 ppm $O_2$) at 320° C. the window for cure is from about 2 minutes to about 120 minutes (See FIG. 1). At 380° C. the window for cure is from about 0.01 minute to about 5 minutes.

When the coatings are not heated long enough, cracks will develop when the coatings are cooled to room temperature. It is believed that it is possible to repair/heal the cracks by further heating the coating for the sufficient period of time. When coatings are heated too long, again cracks will develop when the coatings are cooled to room temperature. However, it is not possible to repair these cracks.

The environment in which the hydrogen silsesquioxane resin film is cured is typically an inert environment such as nitrogen, argon or helium or an environment containing oxygen (e.g. air). As the oxygen content in the environment increases, the minimum time required to cure the hydrogen silsesquioxane resin to a crack-free coating will be reduced. Further, the window of time during which a crack-free coating will be produced will be narrowed. When heating at lower temperatures (e.g. $\leq 330°$ C.) it is preferred to have oxygen present to accelerate the cure. However, when heating at higher temperatures (e.g. $\geq 340°$ C.) it is preferred to use an inert environment.

The curing of the hydrogen silsesquioxane may take place at atmospheric, superatmospheric or subatmospheric pressures, preferably atmospheric pressure. At lower temperatures higher pressures may be used to accelerate the cure. Vacuum may be used at any temperature.

The rate at which the coatings are heated to the soak temperature plays a role to produce crack-free coatings. If the heating rate is fast, then the window of time in which a crack-free coating can be produced will be longer or higher soak temperatures and/or higher coating thicknesses may be achieved without cracking. On the contrary, if the heating rate is slow, then the window of time in which a crack-free coatings can be produced will be shorter or lower soak temperatures and/or reduced coating thicknesses will be necessary to achieve the crack-free coating.

Thick coatings may be produced herein by forming a single thick hydrogen silsesquioxane film and thereafter curing under the controlled conditions. Thick coatings may also be produced herein by forming a thin hydrogen silsesquioxane film, thereafter curing under the controlled conditions and repeating the process until the desired thickness is achieved.

The first layer coatings of this invention have a thickness of at least 1.25 $\mu$m, preferably of 1.25 to 2.25 $\mu$m, and most preferably of 1.5 to 2.2 $\mu$m.

The chemical composition and molecular structure of the insoluble coating produced herein is not fully understood. However, it is believed that the composition is different from insoluble coatings produced using known cure methods based on the unique properties (thickness, crack-free, etc.) that are achieved using the instant cure process.

The second layer of the multi-layer coating of the instant invention is comprised of silicon dioxide produced by deposition (i.e. CVD, PECVD, etc.) of a silicon-containing material having a thickness of at least 100 nm to 2 $\mu$m, preferably at least 170 nm, more preferably at least 200 nm and most preferably at least 300 nm.

The method of applying the second layer is not critical, and such coatings can be applied by any chemical vapor deposition technique such as thermal chemical vapor deposition (TCVD), photochemical vapor deposition, plasma enhanced chemical vapor deposition (PECVD), electron cyclotron resonance (ECR), and jet vapor deposition. It could also be applied by physical vapor deposition techniques such as sputtering or electron beam evaporation. These processes involve either the addition of energy in the form of heat or plasma to a vaporized species to cause the desired reaction, or they focus energy on a solid sample of the material to cause its deposition. Methods for producing silicon dioxide layers by CVD are described in U.S. Pat. No. 4,981,724 to Hochberg et al., herein incorporated by reference.

For example, in thermal chemical vapor deposition, the coating is deposited by passing a stream of the desired precursor gas over a heated substrate. When the precursor gas contacts the hot surface, it reacts and deposits the coating. Substrate temperatures in the range of 25° C. to 1,000° C. are sufficient to form these coatings in several minutes to several hours, depending on the precursor gas and the thickness of the coating. Reactive metals can be used in such a process to facilitate deposition.

In PECVD techniques, a precursor gas is reacted by passing it through a plasma field. Reactive species are formed and focused at the substrate where they readily adhere. The advantage of a PECVD process over a thermal CVD process is that in the former, lower substrate and processing temperatures can be used, i.e., 25° C. to 600° C.

Plasma used in a PECVD process can be energy derived from electric discharges, electromagnetic fields in the radio-frequency or microwave range, lasers, or particle beams. In most plasma deposition processes, it is preferred to use radio frequency (i.e., 10 kHz to $10^2$ MHz) or microwave energy (i.e., 0.1–10 GHz or $10^9$ hertz) at moderate power densities (i.e., 0.1–5 watts/cm$^2$). The frequency, power, and pressure are tailored to the precursor gas and equipment being used.

To produce the silicon dioxide layer there is typically reacted a silicon-containing precursor gas and a source of oxygen. Precursor gases that can be used to produce the silicon dioxide layer include silane; alkylsilanes such as dimethylsilane and trimethylsilane; alkoxysilanes such as orthosilicates such as tetraethylorthosilicate(TEOS); halosilanes such as trichlorosilane; silacyclobutanes; and others.

Sources of oxygen include air, oxygen, ozone, nitrous oxide, nitric oxide and the like.

Other materials such as carrier gases such as helium or argon; dopants such as phosphine or borane; halogens or any other material that would add desirable properties to the second layer may be present.

It has been found that when a layer of silicon dioxide having a thickness of at least 100 nm is deposited over the hydrogen silsesquioxane resin based coating that the multi-layer coatings are stable to subsequent thermal processing.

So that those skilled in the art can understand and appreciate the invention taught herein, the following examples are presented, it being understood that these examples should not be used to limit the scope of this invention found in the claims.

EXPERIMENTAL PROCEDURE

A hydrogen silsesquioxane resin composition comprising 40 wt % hydrogen silsesquioxane resin $(HSiO_{3/2})_n$ prepared according to U.S. Pat. No. 3,615,272 to Collins et al. having an average molecular weight of between 9,800 and 13,900 dissolved in a low molecular weight polydimethylsiloxane was used in the following examples.

Four inch (4") sample wafers were coated with the hydrogen silsesquioxane resin using a Headway spin coater at 2000 rpm for 40 seconds. The wafers used for the experiments were either bare wafers or wafers having a 100 nm layer of PECVD silicon dioxide ("$SiO_2$").

The cure system used consisted of a hotplate, culture petri dish, and modified glass funnel with nitrogen inlets and an infrared temperature reader. The hotplate was preheated to a temperature of 20° C. to 30° C. higher than the temperature listed in Table 1. The spun wafer was introduced in the petri dish by lifting up the glass funnel during which time the nitrogen flow is 2–3 time that used during the cure process. The surface of the wafer was heated to the desired temperature (typically this took 30 to 50 seconds), the nitrogen flow was reduced and the wafer was heated for the desired time at the desired temperature (see Table 1). When the coating was cured in air the cure process was used except that the nitrogen purge was not used.

Following cure the petri dish containing the wafer and the funnel were removed from the hotplate surface and cooled rapidly. The nitrogen flow was maintained until the coating surface temperature was below 30° C.

A coating of silicon dioxide was then applied to the wafers by PECVD using 10% $SiH_4$ in He plus $N_2O$. The wafer temperature during deposition was 350° C. and the pressure was 3000 torr.

Results and specific processing conditions are shown in Table 1.

The wafers having thereon a silicon dioxide coating of 170 nm were not produced in a clean room and the coatings contained particles. The cracking was minor and around the particles. Therefore it is believed that multi-layer coatings wherein the silicon dioxide coatings has a thickness of at least 100 nm will be thermally stable.

TABLE 1

| Cure Condition | | | Coating Thickness | $SiO_2$ Liner Thickness | Cap Thickness | Thermal Processing (Cracked? Y/N) | | | |
|---|---|---|---|---|---|---|---|---|---|
| | | | | | | Cure Cycle | | 450° C. Annealing | |
| Temp (C) | Time (min) | Atmosphere | ($\mu$m) | (nm) | (nm) | 1 | 4 | $N_2$ | $O_2$ |
| 350 | 0.33 | $N_2$ | 1.906 | 100 | 300 | N | N | N | N |
| 350 | 0.42 | $N_2$ | 1.916 | 100 | 300 | N | N | N | N |
| 350 | 0.5 | $N_2$ | 1.901 | 100 | 300 | N | N | N | N |
| 350 | 0.75 | $N_2$ | 1.926 | 100 | 300 | N | N | N | N |
| 350 | 1 | $N_2$ | 1.922 | 100 | 300 | N | N | N | — |
| 350 | 0.5 | Air | 1.521 | 100 | 300 | N | N | N | — |
| 350 | 1 | Air | 1.502 | 100 | 300 | N | N | N | — |
| 350 | 2 | Air | 1.522 | 100 | 300 | N | N | N | — |
| 250 | 1.5 | Air | 1.537 | 100 | 300 | N | N | N | N |
| 250 | 2 | Air | 1.502 | 100 | 300 | N | N | N | N |
| 250 | 1.5 | Air | 1.966 | 100 | 300 | N | N | — | — |

TABLE 1-continued

| Cure Condition | | | Coating Thickness (μm) | SiO₂ Liner Thickness (nm) | Cap Thickness (nm) | Thermal Processing (Cracked? Y/N) | | | |
|---|---|---|---|---|---|---|---|---|---|
| | | | | | | Cure Cycle | | 450° C. Annealing | |
| Temp (C) | Time (min) | Atmosphere | | | | 1 | 4 | N₂ | O₂ |
| 250 | 1.5 | Air | 2.023 | 100 | 300 | N | N | — | — |
| 250 | 2 | Air | 1.986 | 100 | 300 | N | N | — | — |
| 360 | 1 | N₂ | 1.963 | 100 | 1000 | N | N | N | — |
| 360 | 1 | N₂ | 1.877 | 100 | 1000 | N | N | N | — |
| 360 | 1 | N₂ | 1.916 | 100 | 1000 | N | N | N | — |
| 360 | 1 | N₂ | 2.035 | 100 | 1000 | N | N | N | — |
| 340 | 2 | N₂ | 1.987 | 100 | 1000 | N | N | N | — |
| 340 | 2 | N₂ | 2.007 | 100 | 1000 | N | N | N | — |
| 340 | 2 | N₂ | 2.056 | 100 | 1000 | N | N | N | — |
| 340 | 2 | N₂ | 1.947 | 100 | 1000 | N | N | N | — |
| 320 | 2 | N₂ | 1.971 | 100 | 1000 | N | N | N | — |
| 320 | 3 | N₂ | 2.009 | 100 | 1000 | N | N | N | — |
| 350 | 0.33 | N₂ | 1.955 | 100 | none | N | N | Y | — |
| 350 | 1 | N₂ | 1.922 | 100 | none | N | N | Y | — |
| 250 | 2 | Air | 1.986 | 100 | none | N | N | Y | — |
| 350 | 2 | Air | 1.522 | 100 | none | N | N | Y | — |
| 340 | 2 | N₂ | 1.987 | 100 | 170 | N | N | Y | — |
| 340 | 2 | N₂ | 2.007 | 100 | 170 | N | N | Y | — |
| 360 | 1 | N₂ | 1.963 | 100 | 170 | N | N | Y | — |
| 360 | 1 | N₂ | 1.877 | 100 | 170 | N | N | Y | — |

What is claimed is:

1. A method of producing a multi-layer coating comprising applying a fillerless composition comprising hydrogen silsesquioxane resin onto a substrate to form a film having a thickness of 1.25 μm to 2.25 μm;

heating the film at a temperature of 150° C. to 500° C. in an inert or oxygen containing environment for a time sufficient to produce an insoluble coating free of cracks having a thickness of 1.25 μm to 2.25 μm;

depositing a layer of silicon dioxide having a thickness of at least 100 nm over the insoluble coating.

2. The method as claimed in claim 1 wherein the hydrogen silsesquioxane resin consists of units of the formula HSi(OH)$_x$(OR)$_y$O$_{z/2}$, in which each R is independently an organic group or a substituted organic group which, when bonded to silicon through the oxygen atom, forms a hydrolyzable substituent, x=0 to 2, y=0 to 2, z=1 to 3, x+y+z=3.

3. The method as claimed in claim 2 wherein the hydrogen silsesquioxane resin is of the formula (HSiO$_{3/2}$)$_n$ where n is 8 or greater.

4. The method as claimed in claim 1 wherein the fillerless composition also contains a solvent and the solvent is removed to form the film.

5. The method as claimed in claim 4 wherein the solvent is a linear polydimethylsiloxane.

6. The method as claimed in claim 4 wherein the fillerless composition contains from 50 to 80 wt % solvent.

7. The method as claimed in claim 1 wherein the fillerless composition is applied by spin coating.

8. The method as claimed in claim 4 wherein the fillerless composition is applied by spin coating.

9. The method as claimed in claim 1 wherein the film is heated at a temperature of from 200° C. to 400° C.

10. The method as claimed in claim 1 wherein the film is heated at a temperature of from 300° C. to 380° C.

11. The method as claimed in claim 1 wherein the film is heated in an inert environment.

12. The method as claimed in claim 11 wherein the inert environment is nitrogen.

13. The method as claimed in claim 1 wherein the film is heated in an oxygen containing environment.

14. The method as claimed in claim 13 wherein the oxygen containing environment is air.

15. The method as claimed in claim 1 wherein the film is heated to a temperature of 150° C. to 330° C. in an oxygen containing environment.

16. The method as claimed in claim 1 wherein the insoluble coating has a thickness of 1.5 μm to 2.2 μm.

17. The method as claimed in claim 1 wherein the substrate is an electronic substrate.

18. The method as claimed in claim 17 wherein the fillerless composition is applied on the electronic substrate over metallization.

19. The method as claimed in claim 1 wherein silicon dioxide is deposited by chemical vapor deposition.

20. The method as claimed in claim 19 wherein the silicon dioxide is deposited by plasma enhanced chemical vapor deposition.

21. The method as claimed in claim 1 wherein the silicon dioxide has a thickness of 300 nm to 2 μm.

22. The method as claimed in claim 1 wherein the silicon dioxide is deposited by chemical vapor deposition using SiH$_4$ and a source of oxygen.

23. The method as claimed in claim 1 wherein the silicon dioxide is deposited by chemical vapor deposition using trimethylsilane and a source of oxygen.

24. The method as claimed in claim 1 wherein the substrate has a layer of primary passivation there on having a thickness of 30 nm to 300 nm.

25. The multi-layer coating produced by the method as claimed in claim 1.

26. The multi-layer coating produced by the method as claimed in claim 24.

27. A method of producing a multi-layer coating comprising applying a fillerless composition comprising hydrogen silsesquioxane resin onto a substrate to form a film having a thickness of 1.25 μm to 2.25 μm;

heating the film at a temperature of 150° C. to 500° C. in an inert or oxygen containing environment while controlling cure conditions to produce an insoluble coating free of cracks having a thickness of 1.25 µm to 2.25 µm;

depositing a layer of silicon dioxide having a thickness of at least 100 nm over the insoluble coating.

* * * * *